United States Patent
Okuda

(10) Patent No.: US 7,822,593 B2
(45) Date of Patent: Oct. 26, 2010

(54) PRODUCTION PROGRAM CREATING SYSTEM

(75) Inventor: Tadamasa Okuda, Tokyo (JP)

(73) Assignee: Juki Corporation, Chofu-shi, Tokyo (JP)

( * ) Notice: Subject to any disclaimer, the term of this patent is extended or adjusted under 35 U.S.C. 154(b) by 654 days.

(21) Appl. No.: 11/790,184

(22) Filed: Apr. 24, 2007

(65) Prior Publication Data

US 2008/0228295 A1    Sep. 18, 2008

(30) Foreign Application Priority Data

Apr. 25, 2006    (JP)    ............................ P.2006-119972

(51) Int. Cl.
G06F 9/44    (2006.01)
(52) U.S. Cl. ............................... 703/20; 703/7; 700/31; 700/86; 700/117; 29/740; 29/742
(58) Field of Classification Search ...................... 703/6, 703/7, 13, 20, 22; 700/28–31, 95, 117, 86; 29/739–743
See application file for complete search history.

(56) References Cited

U.S. PATENT DOCUMENTS

| 7,222,413 | B2 * | 5/2007 | Hamasaki et al. | ............. | 29/740 |
| 2002/0029486 | A1 * | 3/2002 | Uchiyama et al. | ............. | 33/645 |
| 2002/0092157 | A1 * | 7/2002 | Yoshida et al. | ................ | 29/740 |
| 2004/0033128 | A1 * | 2/2004 | Kabeshita et al. | ........... | 414/935 |
| 2004/0073322 | A1 * | 4/2004 | Maenishi et al. | .............. | 700/28 |

FOREIGN PATENT DOCUMENTS

| JP | 2003-229696 | 8/2003 |
| JP | 2004-319719 | 11/2004 |

OTHER PUBLICATIONS

Fujimura et al., K. Optimization of Electronic Chip-Mounting Machine Using SOM-TSP Method with 5 Dimensional Data, IEEE International Conference on Info-tech and Info-net, Oct.-Nov. 2001, pp. 26-31.*

Fujimura et al., K. Optimization of Electronic Chip-Mounting Using SOM-TSP Method with 5 Dimensional Data, IEEE International Conference on Info-tech and Info-net, Oct.-Nov. 2001, pp. 26-31.*

* cited by examiner

*Primary Examiner*—Russell Frejd
(74) *Attorney, Agent, or Firm*—Drinker Biddle & Reath LLP

(57)    ABSTRACT

A production program creating system creates a production program having a module in which a processing for producing a board is described. The board is produced by mounting an electronic component supplied from a component feeding device onto the board by means of a component mounting device. The component mounting device is described in model form, and a configuration information of the component mounting device is stored in a database. The module is created such that the module works with respect to the component mounting device that is described in model form, and such that the module performs a generalized processing by acquiring the configuration information of the component mounting device from the database.

12 Claims, 7 Drawing Sheets

PRODUCTION PROGRAM CREATING SYSTEM

The present invention claims priority from Japanese Patent Application No. 2006-119972 filed on Apr. 25, 2006, the entire content of which is incorporated herein by reference.

BACKGROUND OF INVENTION

1. Field of the Invention

The present invention relates to a production program creating system. More specifically, the present invention relates to a production program creating system which creates a production program in which various kinds of processings are described as modules. The various kinds of processings are for producing a board by mounting an electronic component on the board by means of a component mounting device, the electronic component being supplied from a component feeding device.

2. Background Art

A component mounting device (a mounter) sucks an electronic component supplied from a feeder by means of a suction head and moves the suction head to a predetermined position on a board, thereby mounting the component on the board. A production of a board (a mounting of components) is carried out by creating a production program for each kind of a board. Each production program includes various data for producing a board with a mounting device, e.g., data related to a board, data related to amounting position, data related to a component (for example, length, width and height dimensions), data related to a sucking position, information for an image recognition, and data related to coating of an adhesive agent.

Generally, a plurality of component mounting devices is installed in assembly lines, and a plurality of dispensers is also installed, whereby a production of a plurality of kinds of boards is carried out. When producing a plurality of kinds of boards, a plurality of production programs is created such as to constitute a single program (formed into a cluster) so that the plurality of production programs can be efficiently performed in a shortest time period. Inside the clustered production program, an optimization of the production program or a feeder arrangement is carried out so as not to necessitate a rearrangement of feeders when a kind of a board to be produced is changed (see, e.g., JP-A-2003-229696).

Further, feeders used in respective production programs may be allocated to component mounting devices in order to carry out a balanced production among the respective component mounting devices (see, e.g., JP-A-2004-319719).

As described above, a production program for producing a plurality of kinds of boards is created such that the board can be produced efficiently and within a shortest time period, and such that a production is carried out with a balanced production line. In order to create such a production program, a production program creating system including a plurality of processing modules is used. In this specification, "a module" is a concept that is used, for example, in an engineering design, and indicates a unit or a station that constitutes a part of a system.

By use of a production program creating system, a production line with various component mounting devices having different characteristics can be configured. However, due to a characteristic of the production program creating system, each time a new type of device comes out, the new type of device needs to be supported. According to a system configuration of the related art, since a processing for a new type of device is added to each of the processing modules each time when dealing with a new type of device, there is a disadvantage that processings dependent on a type of a device are scattered throughout the whole system.

For example, as shown in FIG. 7, the production program creating system of the related art includes a plurality of function modules A, B, and C. The function module A may be an optimal processing module which optimizes an arrangement of feeders and clusters production programs, thereby producing a board within a shortest time period. The function module B may be a simulation module which simulates a production in accordance with an actually created program, and the function module C may be a processing module in which other board production processings are described.

Since configuration information tables of various types of devices and machine type dependent processings are scattered inside each module, when a new type of a component mounting device appears in such a system configuration, processings dependent on machine types, configuration information of respective machine types, and configuration information of feeding device need to be updated, whereby a whole system is needed to be modified.

Therefore, there has been a problem that a number of steps required for changing a constituent element of a type of a device or for dealing with a new type of device is large, and that reliability is deteriorated by modifying or correcting the whole system. There has also been a problem with regard to a component feeding device, the problem being similar to those faced in dealing with the type of device.

SUMMARY OF INVENTION

The present invention provides a system capable of creating a reliable production program in a short time period even when a new type of device is added as a component mounting device and/or a component feeding device, or when a constituent element of a component mounting device and/or a component feeding device is changed.

According to a first aspect of the present invention, a production program creating system creates a production program having a module in which a processing for producing a board is described. The board is produced by mounting an electronic component supplied from a component feeding device onto the board by means of a component mounting device. The component mounting device is described in model form, and a configuration information of the component mounting device is stored in a database. The module is created such that the module works with respect to the component mounting device that is described in model form, and such that the module performs a generalized processing by acquiring the configuration information of the component mounting device from the database.

According to a second aspect of the present invention, a production program creating system creates a production program having a module in which a processing for producing a board is described. The board is produced by mounting an electronic component supplied from a component feeding device onto the board by means of a component mounting device. The component feeding device is described in model form, and a configuration information of the component feeding device is stored in a database. The module is created such that the module works with respect to the component feeding device that is described in model form, and such that the module performs a processing by acquiring the configuration information of the component feeding device from the database.

According to a configuration, the module of the production program is created to execute the generalized processing by dynamically acquiring the configuration information of the component mounting device or the component feeding device from the database, but not a processing that is dependent on a specific type of the device. Therefore, even when a constituent element of the existing component mounting device or the existing component feeding device is changed, or even when a new type of device that is capable of being expressed by a model appears, what needs to be changed is only the database. Thus, the number of steps required to create the production program can be reduced when the component mounting device or the component feeding device is changed into a new one, or when a constituent element thereof is changed, whereby a reliability of the system can be maintained.

DETAILED DESCRIPTION

Hereinafter, exemplary embodiments of the invention will be explained in detail with reference to the drawings. The following exemplary embodiments do not limit the scope of the invention.

Figure 4:
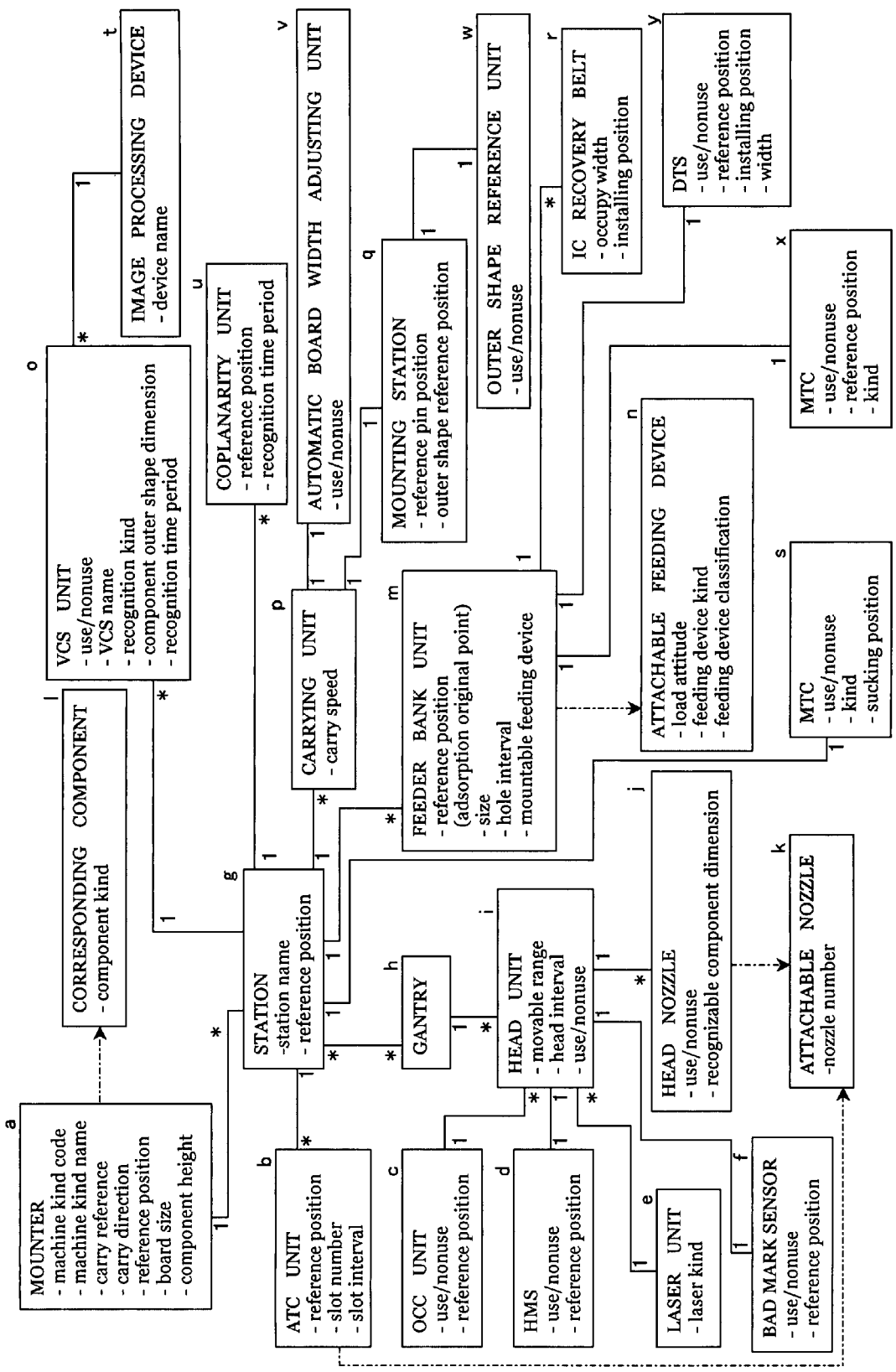
FIG. 4 is a block diagram showing a model configuration of a component mounting device.

In the exemplary embodiments, "model" or "modeling" means to divide a device into blocks of constituent elements (units or stations as shown in FIG. 4).

Figure 1:
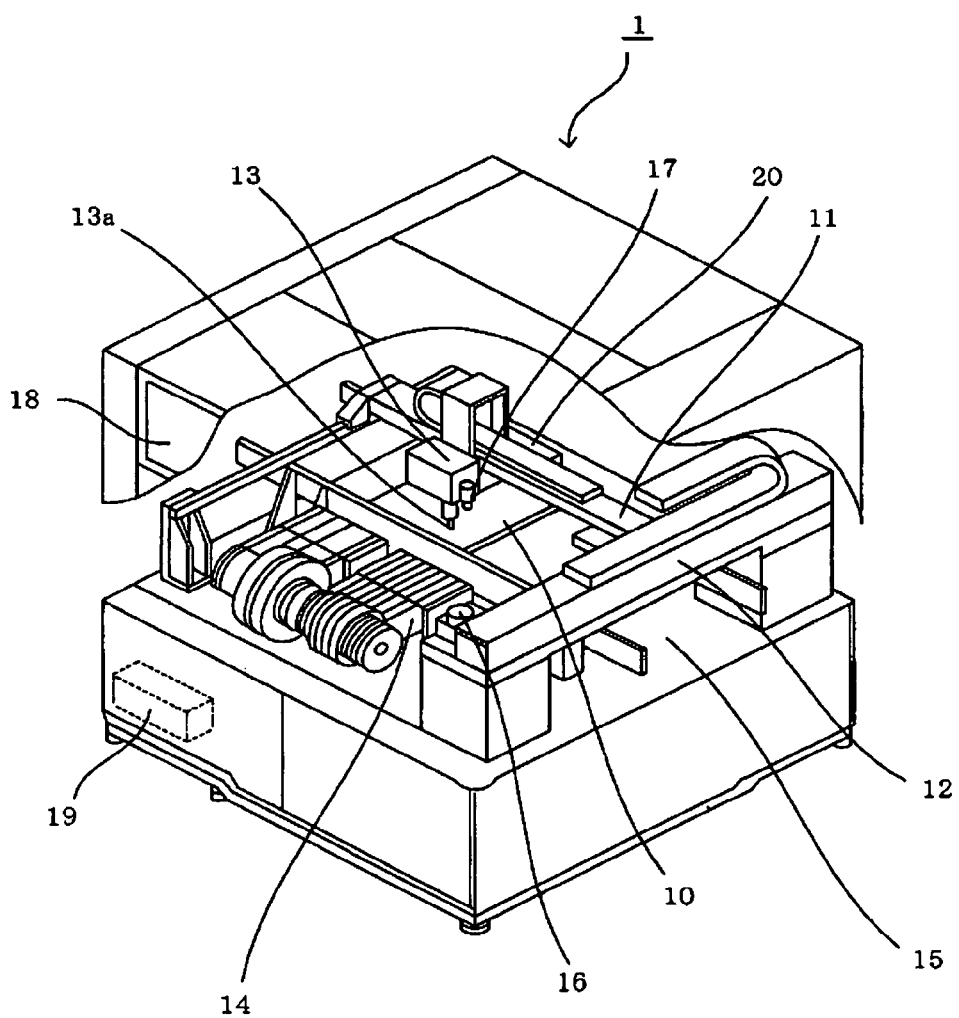
FIG. 1 is a perspective view showing a component mounting device.

FIG. 1 is a view showing a component mounting device (a mounter) 1 which mounts an electronic component (hereinafter, referred to as a component) onto a circuit board. As shown in FIG. 1, a head unit 13 including a suction nozzle 13a is attached to an X axis gantry 11 so as to be able to move in an X axis direction, and the X axis gantry 11 is attached to a Y axis gantry 12 so as to be able to move in a Y axis direction, whereby the head unit 13 is movable in both X and Y axis directions. A component supplied from a component feeding device 14 is sucked by the head unit 13, and is mounted on a predetermined position of a board 10 that is carried along a carrying path 15. The head unit 13 includes a board recognizing camera 17 so as to recognize a displacement of the board, and a component recognizing camera 16 is attached to a bottom portion of the component mounting device 1 in order to recognize a suction orientation of the component. A nozzle interchanging device 20 is disposed at a rear portion of the component mounting device 1 so that a suction nozzle can be changed to one that has a nozzle diameter which corresponds to a size of a component.

In some component mounting devices, the head unit 13 includes a laser unit for recognizing components which do not require a high-accuracy recognition.

An operation monitor 18 is disposed on an upper front face of the component mounting device 1, and displays, e.g., an operation state of the device. A control portion 19 is disposed inside a main body of the component mounting device 1, and carries out a control of the whole device and an image processing. The control portion 19 calculates the displacement of the board by processing an image obtained from the board recognizing camera 17, calculates a suction misalignment of the component based on an image of the component taken by the component recognizing camera 16, and corrects the displacement and/or misalignment, thereby mounting the component on a predetermined position of the board 10 in a proper orientation.

Figure 2:
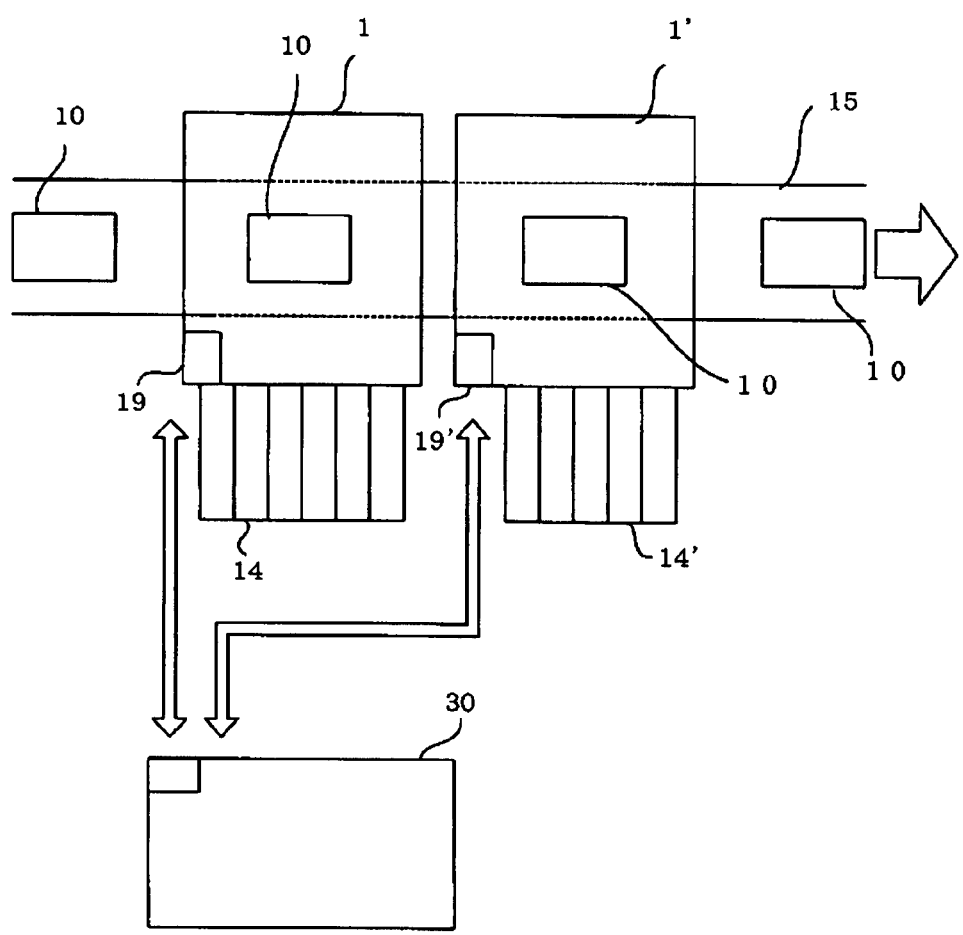
FIG. 2 is an arrangement view showing an arrangement of a component mounting device and a host computer which creates a production program.

When producing a board, as shown in FIG. 2, a plurality of component mounting devices 1, 1' are generally employed (two in this exemplary embodiment), and the board is produced with a line configuration. Each of the component mounting devices 1, 1' has a structure shown in FIG. 1, however, they are schematically illustrated in FIG. 2 in which only component feeding devices 14, 14', each including a plurality of feeders, and control portions 19, 19' are shown. The board 10 is carried to the component mounting device 1 along the carrying path 15, and a component supplied from the component feeding device 14 is mounted on the board 10. Subsequently, the board 10 is carried to the component mounting device 1', and a remaining component supplied from the component feeding device 14' is mounted on the board 10, whereby one sheet of board is produced by cooperation of the two mounting devices 1, 1'.

When producing a board, a board production program created by a host computer 30 is used. The production program created by the host computer 30 is transmitted to the control portions 19, 19', and the respective control portions 19, 19' mount the components supplied from the component feeding device onto the board in accordance with the production program. The production program is created such that a feeder arrangement is optimized in view of shortening a board production time period (a time period for mounting all the components) by the component mounting devices 1, 1'. When producing a plurality of kinds of boards, a plurality of production programs are created, and the plurality of production programs are created as if they constitute a single program (formed into a cluster) so that the plurality of production programs can be efficiently performed in a shortest time period. Inside the clustered production program, an optimization of the production program or a feeder arrangement is carried out so as not to necessitate a rearrangement of feeders when a kind of a board is changed. When producing a single kind of board, the feeders are allocated to the respective component mounting devices 1, 1' such that a total component mounting time period by the component mounting device 1 and a total component mounting time period by the component mounting device 1' are balanced (preferably, such that the respective production time periods of the two devices become substantially equal), whereby a balanced production is carried out between the respective component mounting devices 1, 1'.

Figure 3:
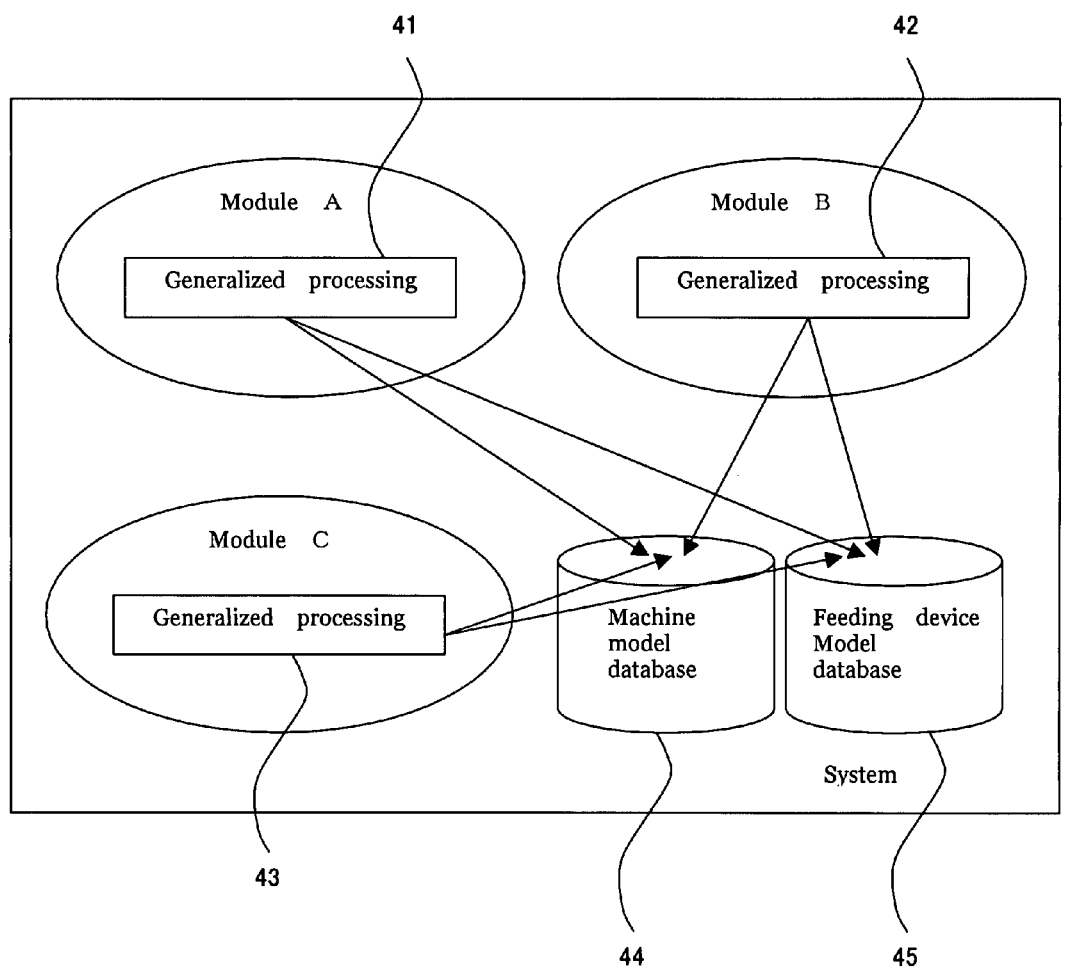
FIG. 3 is an explanatory view showing a state in which generalized modules of a production program are acquiring information from databases.

Generally, as shown in FIG. 3, the production program includes a plurality of modules, module A, module B and module C, and various processings for producing the board are described in each of the modules. For example, the module A is an optimizing module in which an optimization processing of the feeder arrangement is described so that the board production can be carried out within a shortest time period. The module B is a simulation module in which a processing of simulating the board production in accordance with an actually created program is described, and the module C is a module in which other processing of production procedure of the board is described.

According to an exemplary embodiment, a modeling of a component mounting device is performed, such that various types of component mounting devices can be expressed in a model form. Further, generalized processings 41 to 43 by which the component mounting device model can be operated is described in the respective modules A to C.

FIG. 4 shows an example of a model of the component mounting device. In FIG. 4, "MOUNTER" indicates the component mounting devices 1, 1', "STATION" is a station on which component mounting devices are arranged in case where a plurality of component mounting devices are used. "ATC UNIT" corresponds to the nozzle interchanging device 20, "OCC UNIT" corresponds to the board recognizing camera 17, and "GANTRY" corresponds to the X, Y axis gantries 11, 12. "HMS" is a sensor (not illustrated in FIG. 1) adapted for measuring a height of the component, "LASER UNIT" is a unit (not illustrated in FIG. 1) which recognizes a chip component attached to the head unit 13, "BAD MARK SENSOR" is a sensor (not illustrated in FIG. 1) adapted for detecting a bad mark that shows a defect of the board circuit. "HEAD UNIT" corresponds to the head unit 13, "HEAD NOZZLE" corresponds to the suction nozzle 13a, "FEEDER BANK UNIT" corresponds to the component feeding device 14, "VCS UNIT" corresponds to the component recognizing camera 16, and "CARRYING UNIT" corresponds to the carrying path 15. "MTC" indicates a case in which the component feeding device is a tray-type, and "DTS" indicates a case in which a double tray is provided. Including the other constituent elements, FIG. 4 illustrates attributes of respective constituent elements such as use/nonuse. The constituent elements of the component mounting device and the attributes of the respective constituent elements are stored in a machine model database 44.

In FIG. 4, a relationship between the constituent elements are shown by attaching '1' and/or '*' (which means more than 1)'. For example, when '1' and '*' are attached, it shows that the constituent elements has a one-to-many relationship.

Figure 5:
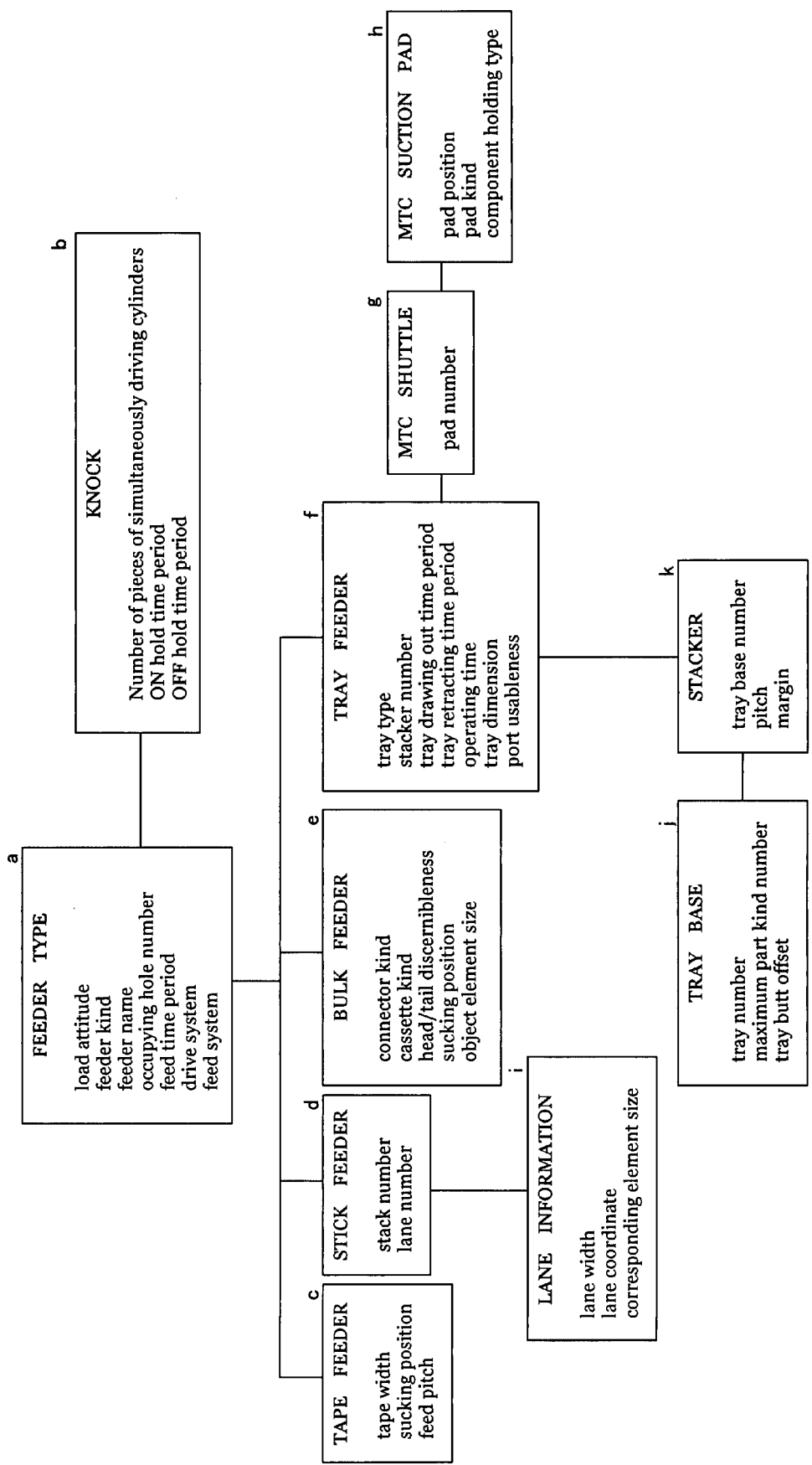
FIG. 5 is a block diagram showing a model configuration of a component feeding device.

Similar to the modeling of the component mounting device, a modeling of the component feeding device is performed so that a configuration thereof can be defined in a database 45, whereby, when a new component feeding device appears, the system can be operated only by updating the database 45 by means of a component feeding device definition wizard or the like. A model of the component feeding device is shown in FIG. 5, and the constituent elements and attributes thereof are stored in the component feeding device database 45. For example, when a new type of a tape feeder appears, the system can deal with it by adding a feeder kind, an occupying hole number, and a knock information thereof to the database 45.

As described above, modeling is performed for the component mounting device and the component feeding device, and the configuration information thereof is formed into a database, while each of the processings 41 to 43 of the respective modules A, B and C are described so as to be operated in a generalized manner with respect to the component mounting device and the component feeding device that are expressed by models. When executing the production program, the configuration information of the actual component mounting device and the component feeding device is acquired by referring to the databases 44, 45, and the generalized processings 41 to 43 described in the modules A to C are executed.

Generalization of the modules A, B and C can be achieved by treating the attributes of a component mounting device and a component feeding device as a set of objects, coding configuration information of various component mounting devices and component feeding devices when creating a production program, and dynamically acquiring the coded configuration information from the databases 44, 45 when executing the production program.

According to such a configuration, even when, for example, a constituent element of an existing component mounting device or an existing component feeding device is changed, it is only the databases 44, 45 that need to be changed since the processings of the modules A, B and C are described in a generalized manner so as not to be influenced by such a change. In a case where a new type of a component mounting device or a new type of a component feeding device which can be expressed by the above-described modeling appears, a constituent element is modified or added in the databases 44, 45 in accordance with the new type, thereby enabling a reduction of rewriting the production program per se.

With regard to a method of updating the machine model database 44 for a new type of a component mounting device, the following method may be adopted.

Figure 6:
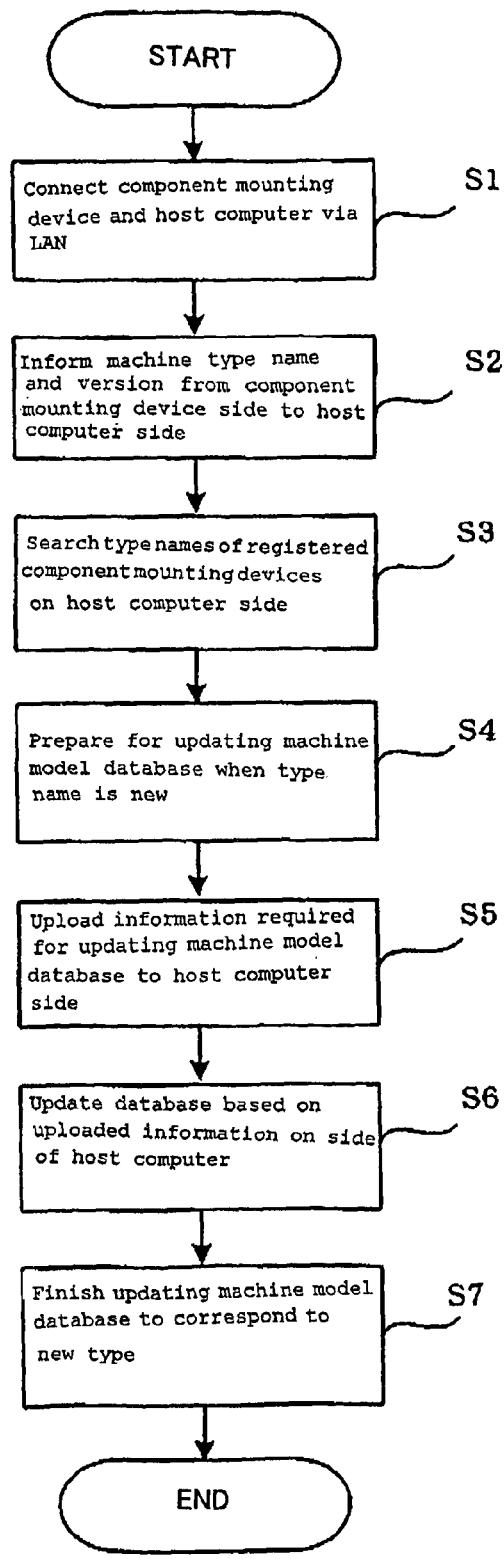
FIG. 6 is a flowchart showing a flow of updating a machine model database.
Figure 7:
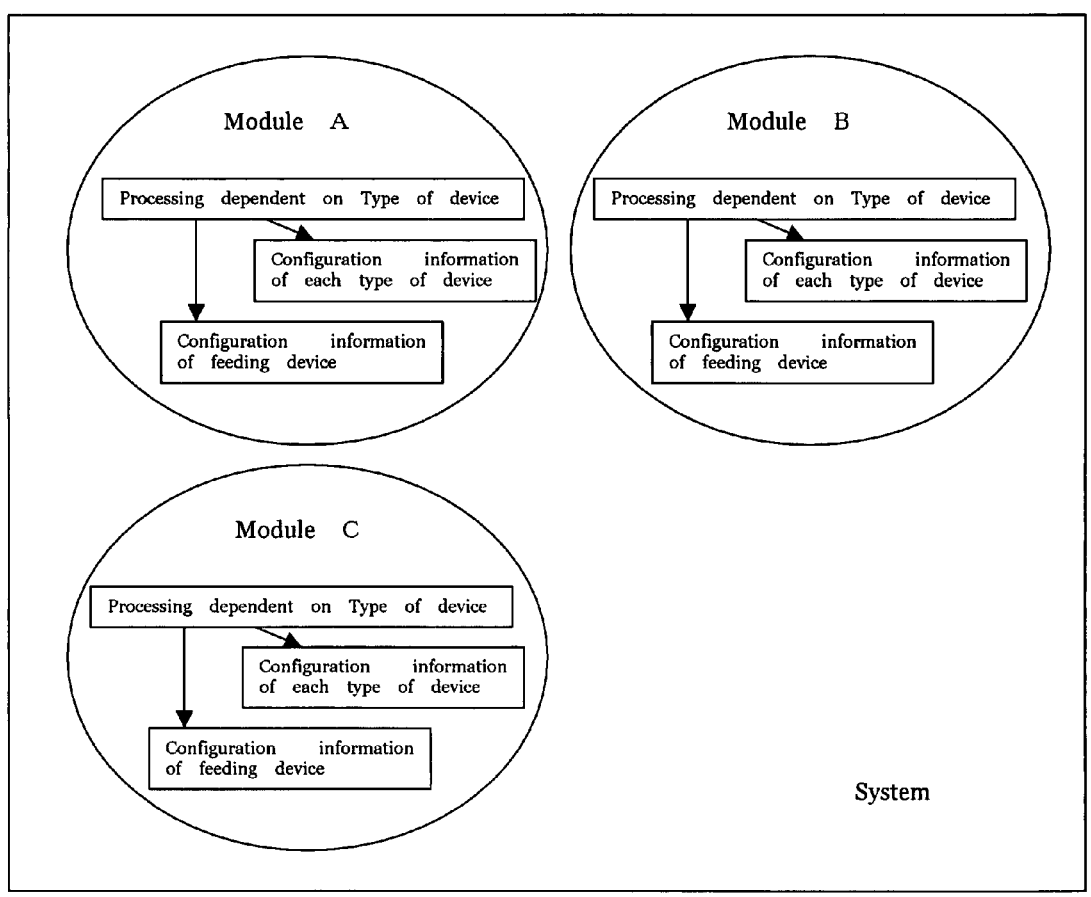
FIG. 7 is a diagram showing a system configuration of a related art.

The component mounting devices 1, 1' and the host computer 30 which creates the production program are connected via a network or the like, and in that state, the host computer 30 can detect whether the component mounting device is a new type or not. When a new type of component mounting device is detected, required information is uploaded from a side of the component mounting device to the machine model database 44 provided on a side of the host computer 30, whereby the database 44 is updated. Such a method is shown in FIG. 6.

First, the component mounting devices 1, 1' and the host computer 30 are connected via a network such as a LAN (step S1), and then a type name and a version of the component mounting device are informed from the side of the component mounting devices 1, 1' to the side of the host computer 30 (step S2). The host computer 30 searches the machine model database 44 (step S3), and when the component mounting devices 1, 1' are a new type, the operation prepares for updating the database (step S4). The component mounting devices 1, 1' upload the information required for updating to the host computer 30 (step S5), and the host computer 30 updates the machine model database 44 based on uploaded information (step S6), whereby the database 44 is updated and the new type of component mounting device becomes supported (step S7).

As another method of operating the machine model database 44, the machine model database 44 may be directly updated on the side of the host computer 30. For example, the machine model database 44 can be updated by describing a machine model definition of a new type in an XML file or the like, and making the file recognized by the host computer 30.

The operations carries out by the host computer 30 in the production program creating system may be based on a computer program product embodied on a computer-readable medium which can be read by the host computer 30.

While description has been made in connection with exemplary embodiments of the present invention, it will be obvious to those skilled in the art that various changes and modification may be made therein without departing from the present invention. It is aimed, therefore, to cover in the appended claims all such changes and modifications falling within the true spirit and scope of the present invention.

What is claimed is:

1. A method of creating a production program, the production program having a module in which a processing for producing a board is described, the board being produced by mounting an electronic component supplied from a component feeding device onto the board by means of a component mounting device, the method comprising:

modeling the component mounting device;

storing a configuration information of the modeled component mounting device in a database; and creating the module such that the module works with respect to the modeled component mounting device, and such that the module performs a generalized processing by dynamically acquiring the configuration information of the component mounting device from the database, the generalized processing being independent of the configuration information of the component mounting device.

2. The method according to claim 1, further comprising:

uploading a configuration information of the component mounting device from the component mounting device to the database when the component mounting device is of a new type; and updating the database so as to correspond to the new type of component mounting device.

3. A method of creating a production program, the production program having a module in which a processing for producing a board is described, the board being produced by mounting an electronic component supplied from a component feeding device onto the board by means of a component mounting device, the method comprising:

modeling the component feeding device;

storing a configuration information of the component feeding device in a database; and creating the module such that the module works with respect to the modeled component feeding device, and such that the module performs a generalized processing by dynamically acquiring the configuration information of the component feeding device from the database, the generalized processing being independent of the configuration information of the component feeding device.

4. The method according to claim 3, further comprising:

uploading a configuration information of the component feeding device from the component feeding device to the database when the component feeding device is of a new type; and updating the database so as to correspond to the new type of component feeding device.

5. A production program creating system comprising:

a host computer which creates a production program, the production program having a module in which a processing for producing a board is described, the board being produced by mounting an electronic component supplied from a component feeding device onto the board by means of a component mounting device; and a database in which a configuration information of the component mounting device is stored in model form, wherein the host computer creates the module such that the module performs a generalized processing by dynamically acquiring the configuration information of the component mounting device from the database, the generalized processing being independent of the configuration information of the component mounting device.

6. The production program creating system according to claim 5, wherein the database further stores a configuration information of the component feeding device in model form, and the host computer creates the module such that the module performs the generalized processing by acquiring the configuration information of the component feeding device from the database.

7. The production program creating system according to claim 5, wherein when a new type of component mounting device of is coupled to the host computer, a configuration information of the new type of component mounting device is uploaded from the component mounting device to the database via the host computer so that the database is updated to correspond to the new type of component mounting device.

8. The production program creating system according to claim 6, wherein when a new type of component feeding device is coupled to the host computer, a configuration information of the new type of component feeding device is uploaded from the component feeding device to the database via the host computer so that the database is updated to correspond to the new type of component feeding device.

9. A computer program product embodied on a computer-readable medium, which when executed by a computer, causes the computer to perform operations comprising:

modeling a component mounting device;

storing a configuration information of the modeled component mounting device in a database; and creating a production program having a module in which a processing for producing a board is described, the board being produced by mounting an electronic component supplied from a component feeding device onto the board by means of the component mounting device, wherein the module is created such that the module works with respect to the modeled component mounting device, and such that the module performs a generalized processing by dynamically acquiring the configuration information of the component mounting device from the database, the generalized processing being independent of the configuration information of the component mounting device.

10. The computer program product according to claim 9, wherein the operations further comprises:

modeling the component feeding device; and storing a configuration information of the modeled component feeding device in the database, wherein the module is created such that the module works with respect to the modeled component feeding device, and such that the module performs a generalized processing by acquiring the configuration information of the component feeding device from the database.

11. The computer program product according to claim 9, wherein the operations further comprises:

uploading a configuration information of the component mounting device from the component mounting device to the database when the component mounting device is of a new type; and updating the database so as to correspond to the new type of component mounting device.

12. The computer program product according to claim 10, wherein the operations further comprises:

uploading a configuration information of the component feeding device from the component feeding device to the database when the component feeding device is of a new type; and updating the database so as to correspond to the new type of component feeding device.

* * * * *